United States Patent [19]

Whitley

[11] Patent Number: 4,484,159

[45] Date of Patent: Nov. 20, 1984

[54] FILTER CONNECTOR WITH DISCRETE PARTICLE DIELECTRIC

[75] Inventor: Thomas J. Whitley, Scarbrough, Canada

[73] Assignee: Allied Corporation, Southfield, Mich.

[21] Appl. No.: 360,506

[22] Filed: Mar. 22, 1982

[51] Int. Cl.$^3$ .......................... H03H 7/01; H01P 1/202

[52] U.S. Cl. .................................... 333/182; 361/302; 361/311; 333/185; 333/206; 339/143 R

[58] Field of Search ............... 333/182, 183, 185, 184, 333/206; 361/433, 321, 302, 311, 301; 339/143 R, 147 R

[56] References Cited

U.S. PATENT DOCUMENTS

| | | | |
|---|---|---|---|
| 3,275,954 | 9/1966 | Coda et al. | 333/183 |
| 3,278,815 | 10/1966 | Booe et al. | 361/321 X |
| 3,380,004 | 4/1968 | Hansen | 333/184 |
| 3,579,155 | 3/1971 | Tuchto . | |
| 3,842,374 | 10/1974 | Schlicke | 333/182 |
| 4,126,840 | 11/1978 | Selvin | 333/182 X |
| 4,144,509 | 3/1979 | Boutros . | |
| 4,195,272 | 3/1980 | Boutros | 333/182 |
| 4,220,547 | 9/1980 | Abe et al. | 361/321 X |

FOREIGN PATENT DOCUMENTS

| | | | |
|---|---|---|---|
| 44077 | 6/1982 | European Pat. Off. | 361/321 |

*Primary Examiner*—Paul L. Gensler
*Assistant Examiner*—Benny Lee
*Attorney, Agent, or Firm*—R. J. Eifler

[57] ABSTRACT

A filter connector incorporates a capacitor formed in the connector with dielectric material consisting of discrete particles maintained in electrical contact with the live and ground electrodes. Since the dielectric material is handled in non-rigid bulk form, no breakage is encountered during assembly and handling. Disassembly of the connector for repair is feasible. Both method and apparatus are described.

12 Claims, 4 Drawing Figures

FIG. 3
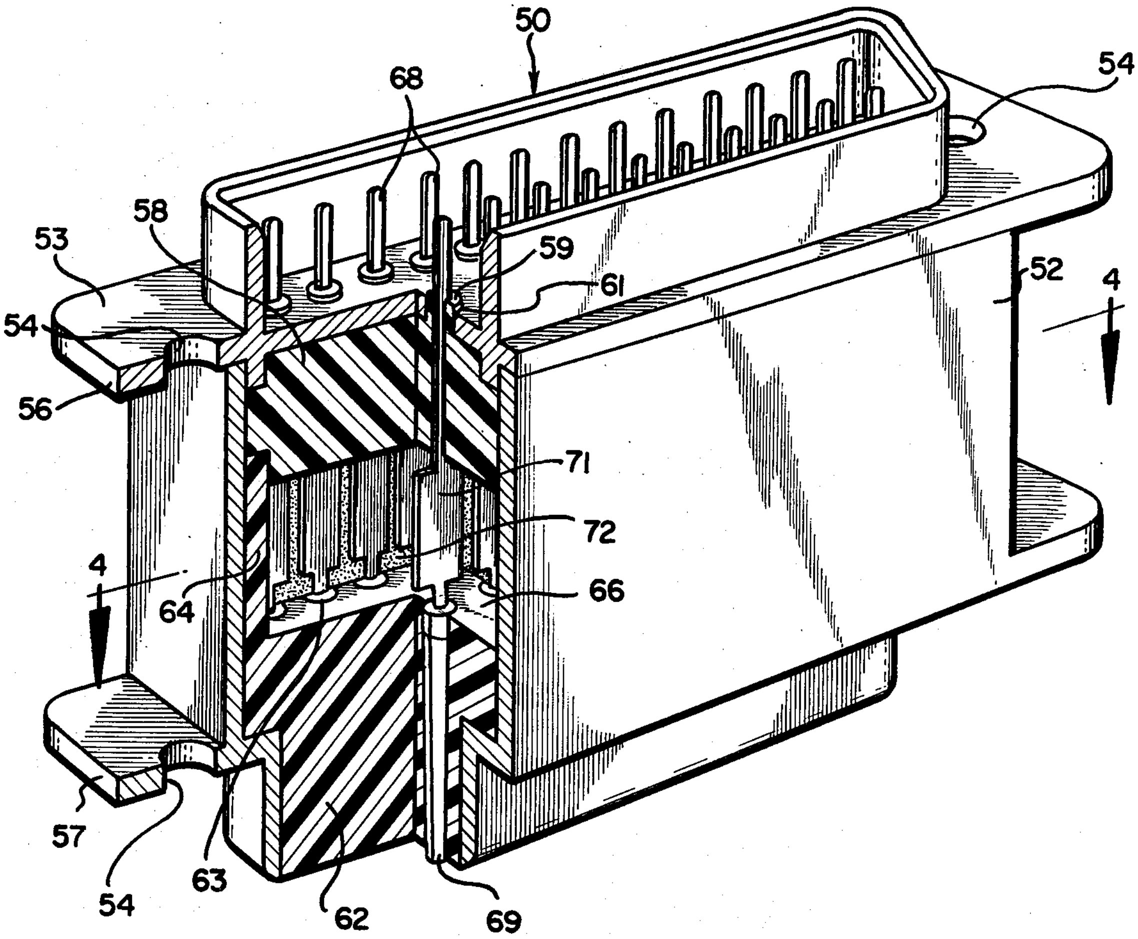
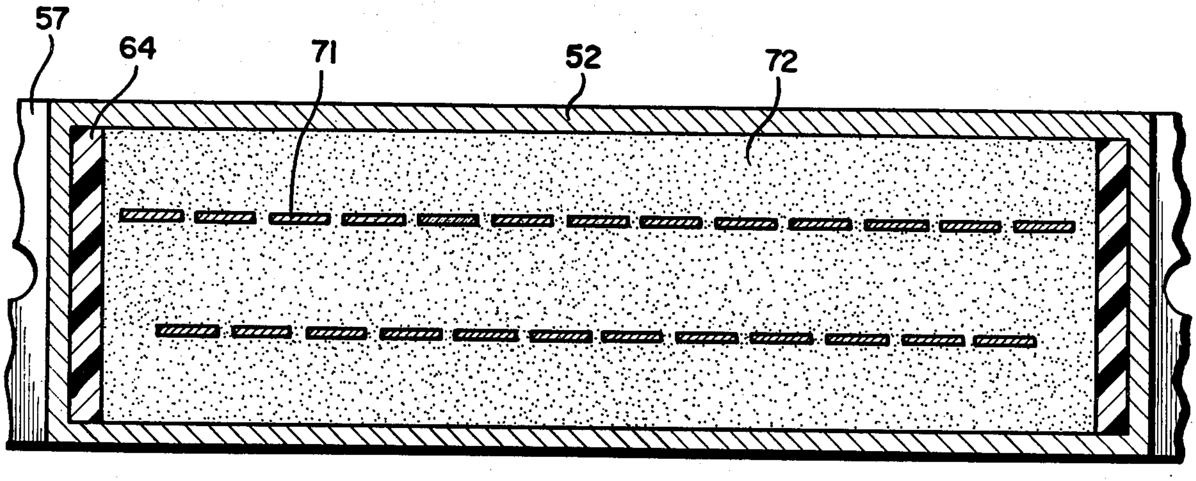
FIG. 4

FILTER CONNECTOR WITH DISCRETE PARTICLE DIELECTRIC

The present invention relates generally to electrical connectors of a type providing protection from electromagnetic interference (EMI). More particularly the invention relates to an economically manufacturable connector incorporating a capacitive filter which is formed with discrete particles of a solid radio frequency dielectric material, and to a method of fabricating the same.

BACKGROUND OF THE INVENTION

It is known in the construction of electrical connectors for use in circuits carrying high frequency signals to provide, as an integral part of the connector, an electrical filter network for filtering electromagnetic interference which may exist. Such filter networks may include one or more filter elements comprising either sintered or fused slabs or tubes of a ceramic dielectric material, typically barium titanate. The resulting ceramics are rigid, costly, extremely fragile, and highly susceptible to damage during fabrication of the connector. In addition, repair of a faulty connector involving replacement of a defective part is generally impractical, since disassembly of the connector is usually impossible without extensive damage to the fragile filter components. Accordingly, defective filter connectors are often discarded rather than repaired, even though the individual parts are expensive. Further, connectors manufactured with filter capacitors constructed in accordance with the invention will have much increased immunity to breakage during normal shock and vibration encountered during use.

A filter connector using rigid cylindrically shaped dielectrics is shown in U.S. Pat. No. 3,579,155 issued Mar. 18, 1971 to Jeff Tuchto and assigned to the Bunker-Ramo Corporation. While a "pi" type filter having ferrite inductance elements is shown, the capacitive dielectric is a ceramic cylinder with metallized surfaces forming the capacitor plates which is typical of the prior art. As indicated in the patent text, these ceramic elements are very fragile.

U.S. Pat. No. 4,144,059 issued Mar. 13, 1979 to Kamal Boutros and assigned to Bunker Ramo Corporation depicts a typical configuration in which the filter element or dielectric is in planar form with through holes for passage of the live electrodes, often referred to as pin and/or socket contacts. In this patent the conductive elements of the capacitor consist of metallized areas on the dielectric surface. Here again the sintered dielectric is quite fragile and if any individual capacitor element becomes defective the entire assembly may have to be discarded.

SUMMARY OF THE INVENTION

It is an object of the present invention to reduce the cost of manufacturing and repairing filter connectors while making them more immune to failure by eliminating the breakage and delicate handling required incident to use of fragile, pre-formed fired ceramic filter dielectric elements. This object is attained by forming the capacitor in the connector with a dielectric of a powder, paste, or slurry of discrete particles of barium titanate or other suitable material. The dielectric is deposited (poured) and compacted into an appropriate cavity between the live electrodes and ground electrode in the connector which form the capacitor plates. Since the dielectric material is not fragile, no breakage is encountered during assembly, handling, or disassembly of the connector for repair.

DESCRIPTION OF THE DRAWINGS

The invention will best be understood from the following detailed discussion taken in conjunction with the accompanying drawings, in which:

FIG. 3 is an isometric view in partial section of a multi-live electrode, telephone type connector constructed in accordance with the invention; and FIG. 4 is a sectional view of the connector of FIG. 3 taken along line 4—4.

DESCRIPTION OF PREFERRED EMBODIMENTS

Figure 1:
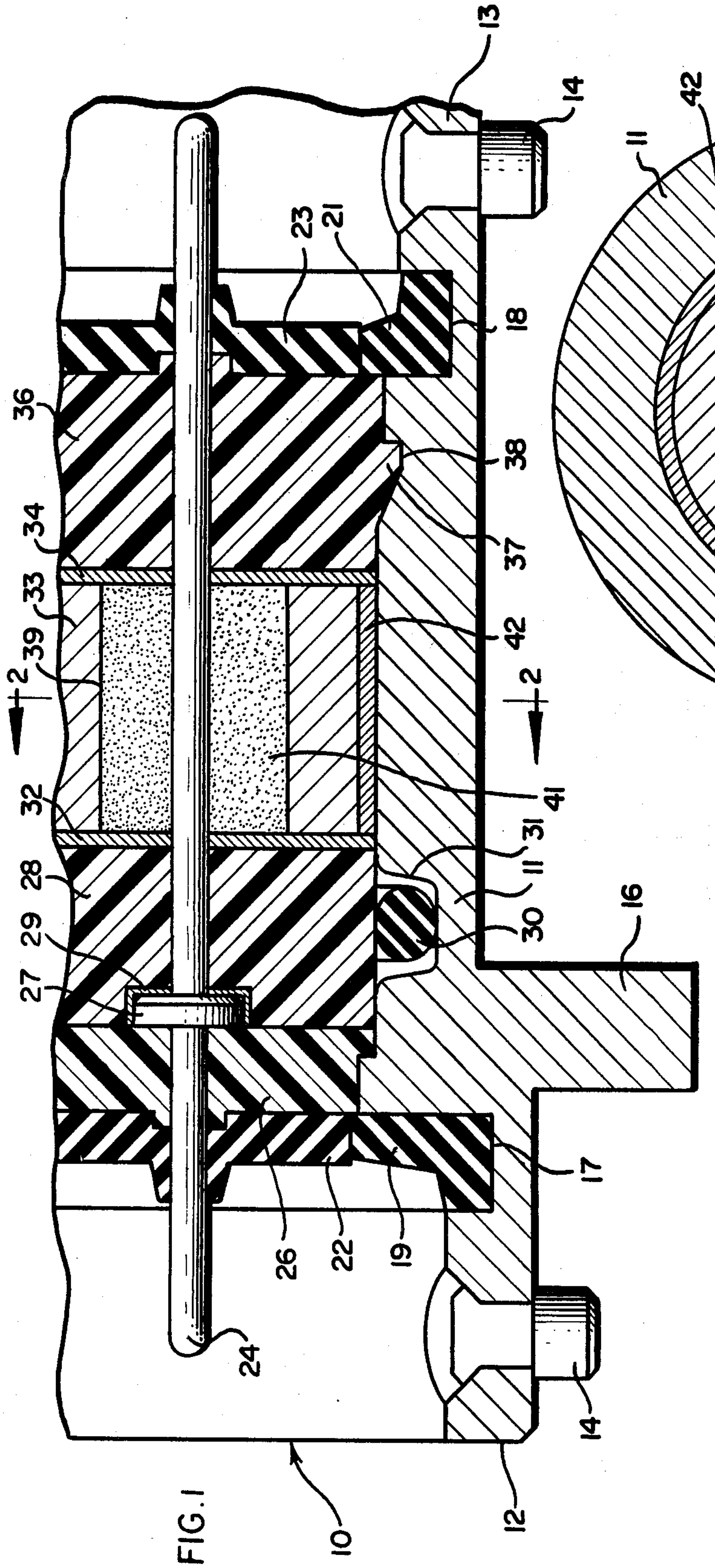
FIG. 1 is a fragmentary sectional view of a single, live electrode, circular connector constructed in accordance with the present invention.
Figure 2:
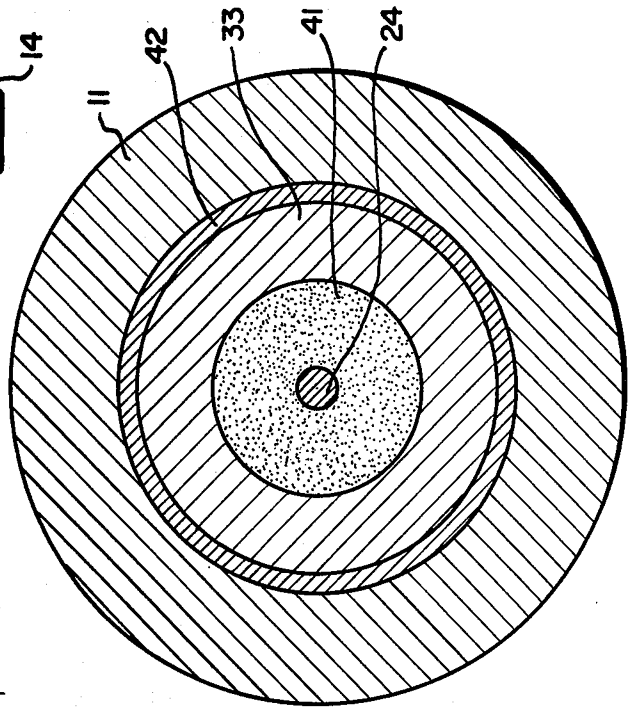
FIG. 2 is a cross-section of the connector of FIG. 1 taken along line 2—2.

FIGS. 1 and 2 disclose one embodiment of the invention in which a filter connector 10 comprises a generally tubular outer shell or body 11 having an open front end 12 and an open rear end 13, each provided with outwardly extending radial pins 14 which are used as keys for alignment with mating connectors (not shown). The front of connector 10 is provided with a circumferential flange 16 for use in mounting the connector to a panel or other support structure. Since mounting details are not germane to the invention, they have been omitted. Outer shell 11 is electrically conductive and preferably formed of a suitable metal. Alternatively, body 11 can be made of a non-conductive material which has had at least a portion of its inner surface rendered conductive by plating or coating with a conductive metal.

Shell 11 includes front and rear internal annular grooves 17 and 18. Grommets 19 and 21, suitably formed of a resilient material such as a fluorosilicone rubber are positioned within annular grooves 17 and 18, respectively. Sealing grommet 19 and sealing grommet 21 engage a front face seal 22 and a rear face seal 23, respectively, each provided with a central bore through which an elongated pin electrode 24 extends. Pin electrode 24 is more generally referred to as a live electrode since it operates at signal potentials, as opposed to being at ground potential. Immediately adjacent front face seal 22 is a front insulating insert 26 provided with a concentric bore or passageway for live electrode 24. A flange 27, formed on the live electrode, positions the electrode when it is inserted through the front face seal and front insert from the rear of the connector. An intermediate insulating insert 28, provided with a recess 29 to accommodate flange 27 and a central bore for electrode 24, is adjacent front insert 26. An "O" ring 30, received in an internal annular groove 31 in shell 11, seals the interior of the connector.

Located within shell 11 from intermediate insert 28 to rear face seal 23 are in order, an end seal 32, a metallic cylinder 33 (which also functions as a ground electrode) an end seal 34, and a rear insulating insert 36, provided with a locking tab 37 received in an appropriate recess 38 in the interior wall of shell 11. Each of elements 32, 33, 34 and 36 is suitably apertured to provide a passageway for live electrode 24.

Metallic cylinder 33, in conjunction with end seals 32 and 34, forms a central cavity 39 that is filled with a powdered dielectric 41 and is maintained in mechanical and electrical contact with shell 11 through a conductive epoxy cement 42. Dielectric 41, in conjunction with cylinder 33 and electrode 24, forms a capacitor for shunting to shell 11 any EMI arising on electrode 24. (In practice, shell 11 is at electrical ground potential and thus the EMI is shunted to ground.)

The dielectric consists of discrete particles of a finely divided low-loss radio frequency solid dielectric material having a range of particle sizes desirably below about 10 microns such as to produce a high average particle to particle contact area and an appropriately high dielectric constant. A preferred material is barium titanate, although other similar materials may also be used. Dielectric 41 may be a powder either mechanically packed within cavity 39 in cylinder 33 or carried in slurry form in a suitable inert liquid, which is evaporated after the cavity is filled. In an alternative embodiment, the powder may be formed into a paste by mixing with a low-loss dielectric resin, such as polystyrene, in a suitable solvent, which is evaporated after insertion into the cavity, or by mixing with a molten resin (also polystyrene) which is allowed to cool and solidify within the cavity.

The use of dielectric resin to form a paste is advantageous in that, in addition to facilitating introduction of the material into the cavity, it fills the interstices between the solid particles very well, which spaced would otherwise be filled with air which has a lower dielectric constant. The proportion of resin in the paste is preferably no greater than required to fill the interstices between the solid dielectric particles.

As mentioned, an electrical connection between the outer surface of cylinder 33 and the inner wall of body 11 is formed by conductive epoxy cement 42. It should be recognized that other conductive materials may also be used. Under appropriate circumstances and depending on the electrical characteristics required in the filter, cylinder 33 may be omitted and the dielectric material added to the cavity defined by the inner wall of body 11 and end seals 32 and 34. In that instance body 11 serves as the ground electrode directly.

The connector is assembled in the following manner. Front face seal 22, annular sealing ring 19, and front insulating insert 26 are assembled in the front end of the body. Electrode 24 is inserted from the rear of the body through the central apertures in each of these elements until flange 27 abuts front insert 26. Intermediate insulating insert 28 is then inserted together with "O" ring 30, followed by end seal 32 and metal cylinder 33 which is secured by conductive epoxy 42. Dielectric 41 consisting of loose powder is added to cavity 39 in cylinder 33 and compacted if necessary. After insertion of end seal 34, rear insulating insert 36 is placed in the body, with tab 37 being snapped into position in recess 38. Finally, sealing ring 21 and rear face seal 23 are installed. It will be seen that a connector assembled in this manner can be disassembled by reversing the above steps and that such disassembly involves no danger of damage to fragile elements, such as the preformed ceramic dielectric element typically used in the prior art.

It will be appreciated that should the dielectric selected be in the form of a slurry or a paste, then appropriate steps for driving off the liquid in the slurry or solidifying the paste will be required, i.e. in the case of a slurry the inert liquid may be driven off by evaporation and in the case of a molten resin, the mixture is allowed to cool and harden. Possible contamination by loose powder or slurry is not a problem because of the very high quality dielectric that is involved, which would not create a leakage path. It will be noted that care is to be exercised to prevent air gaps in the dielectric which could adversely affect the filter.

Although the embodiment of FIG. 1 is shown as having only one live electrode, it will be apparent that a multi-electrode circular connector can be made in an analogous manner, by modifying components 22, 23, 26, 28, 32, 33 34 and 36 to accommodate a plurality of spaced parallel electrodes 24.

In FIGS. 3 and 4, a multi-electrode filter connector 50 comprises a two-piece shell consisting of a hollow metal body 52 with flanges 57 and a metal cover 53 with corresponding flanges 56. Cover 53 forms a plurality of apertures 61 for accommodation of a corresponding plurality of live electrodes, and their associated insulation, and partially nests within body 52. It is fastened to the body by suitable means, such as bolts (not shown) passing through holes 54 in the flanges.

A front insulating insert 58 abutting cover 53, forms a plurality of cylindrical apertures and extensions for passage of the live electrodes. Extensions 59 space the live electrodes from the openings in the metal cover. A rear insulating insert 62 has a front face 63 spaced from the rear face of insert 58 by extensions 64 to form a generally transverse cavity 66 communicating with the conductive walls of body 52.

Connector 50 has a plurality of live electrodes each including a pin end 68 passing through a respective bore and associated extension in insert 58 and a socket end 69 passing through respective bores in rear insert 62. Each electrode includes a central plate section 71 exposed to cavity 66 and positioned parallel to the exposed walls of body 52, which form the ground electrode.

Cavity 66 is packed with a dielectric 72 comprising discrete particles of a finely divided solid dielectric material corresponding to dielectric material 41 of connector 10 as previously described. The plate section of each live electrode, the dielectric and the conductive walls of the body form a filter capacitor for eliminating EMI from the live electrode.

Connector 50 is assembled in a manner similar to that described for connector 10. Rear insert 62, into which socket ends 69 of the live electrodes have been inserted, is installed in body 52, and cavity 66 is filled with powdered dielectric 72. Front insert 58 is positioned with live electrode pin ends 68 passing through the bores therein, after which cover 53 is installed over extensions 59 and secured with means (not shown) through holes 54. If any element in the assembled connector is found to be defective, the connector may be readily disassembled and the problem corrected without further damage.

It will be apparent to those skilled in that art that the discrete-particle-dielectric capacitors of the invention may be used for connectors incorporating inductive elements such as ferrite sleeves or bars, to form more complex filters. It should further be obvious that the connectors and parts thereof are not shown to scale, but rather have been drawn to clearly illustrate the principles of the invention. Further, the embodiment shown in FIGS. 3 and 4 may include a conductive ground electrode extending between the two rows of plate sections of the live electrodes for increased capacitance, shielding and the like.

What has been described in a novel filter connector and method which is free from the deficiencies enumerated in the prior art and which is economical to practice. It is recognized that numerous modifications in the described embodiments of the invention including the planar and discoidal form may be made by those skilled in the art without departing from the true spirit and scope of the invention as set forth in the claims.

What is claimed is:

1. A filter connector comprising:

an electrically conductive tubular body having a central axis;

a first electrode coaxially mounted within said tubular body and spaced from said body;

a tubular electrode coaxially mounted within said body and around and spaced from said first electrode; and an electrically insulating body consisting of a plurality of discrete barium titanate particles located in the space between and in contact with said first and tubular electrodes.

2. The filter connector as recited in claim 1 wherein said barium titanate particles have a particlar size of less than 10 microns.

3. The filter connector as recited in claim 1 wherein said barium titanate particles are compacted in said space between said electrodes.

4. The filter connector as recited in claim 2 wherein said barium titanate particles are compacted in said space between said electrodes.

5. The filter connector as recited in claim 1 wherein said barium titante particles are disposed in a low loss dielectric resin.

6. The filter connector as recited in claim 2 wherein said barium titanate particles are disposed in a low loss dielectric resin.

7. A filter connector comprising;

an electrically conductive tubular body;

a plurality of first electrodes within said tubular body and electrically isolated therefrom; and an electrically insulating body located between said electrodes and said body, said insulator consisting of a plurality of discrete particles of barium titanate.

8. The filter connector as recited in claim 7 wherein the particle size of the barium titanate is less than 10 microns.

9. The filter connector as recited in claim 7 wherein said barium titanate particles are compacted in said space between said electrodes and said tubular body.

10. The filter connector as recited in claim 8 wherein said barium titanate particles are compacted in said space between said electrodes and said tubular body.

11. The filter connector as recited in claim 7 wherein said barium titanate particles are disposed in a low loss dielectric resin.

12. The filter connector as recited in claim 8 wherein said barium titanate particles ae disposed in a low loss dielectric resin.

* * * * *